(12) United States Patent
Nanba et al.

(10) Patent No.: US 6,717,457 B2
(45) Date of Patent: Apr. 6, 2004

(54) SEMICONDUCTOR DEVICE WITH TEMPERATURE COMPENSATION CIRCUIT

(75) Inventors: Hiromi Nanba, Kawasaki (JP); Kenichi Minobe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/098,558

(22) Filed: Mar. 18, 2002

(65) Prior Publication Data

US 2003/0067344 A1 Apr. 10, 2003

(30) Foreign Application Priority Data

Oct. 9, 2001 (JP) .................................. 2001-311594

(51) Int. Cl.$^7$ ............................................. H01L 35/00
(52) U.S. Cl. ....................................................... 327/513
(58) Field of Search .................................. 327/512, 513

(56) References Cited

U.S. PATENT DOCUMENTS

| | | | |
|---|---|---|---|
| 4,345,477 A | | 8/1982 | Johnson |
| 4,883,992 A | * | 11/1989 | Koglin et al. ............... 327/513 |
| 5,455,510 A | * | 10/1995 | Nelson ........................ 324/252 |
| 5,639,163 A | * | 6/1997 | Davidson et al. ........... 374/178 |
| 5,795,069 A | * | 8/1998 | Mattes et al. ............... 374/183 |
| 5,796,291 A | * | 8/1998 | Mattes et al. ............... 327/513 |
| 5,909,132 A | * | 6/1999 | Trofimenkoff et al. ...... 327/101 |
| 5,990,720 A | * | 11/1999 | Tokioka et al. ............. 327/253 |
| 6,133,776 A | * | 10/2000 | Yunus ......................... 327/361 |
| 6,181,192 B1 | * | 1/2001 | Tohyama et al. ........... 327/513 |
| 6,320,450 B1 | * | 11/2001 | Lee et al. .................... 327/513 |
| 6,441,674 B1 | * | 8/2002 | Lin .............................. 327/512 |

FOREIGN PATENT DOCUMENTS

| | | |
|---|---|---|
| EP | 0 695 933 A1 | 2/1996 |
| EP | 0 868 024 A1 | 9/1998 |
| GB | 0 345 597 A | 7/2000 |

* cited by examiner

*Primary Examiner*—Jeffrey Zweizig
(74) *Attorney, Agent, or Firm*—Arent Fox PLLC (57) ABSTRACT

A semiconductor device with temperature compensation functions and a temperature change detecting device which detect temperature changes accurately, without requiring extra mounting space. A sensor unit is composed of first semiconductor components (first-type resistors) having a certain temperature coefficient and second semiconductor components (second-type resistors) having a different temperature coefficient. They are located in the vicinity of a processing circuit that needs temperature compensation. Changes in the temperature of the processing circuit are detected by a temperature change detector which observes a certain property (e.g., resistance) of the first and second semiconductor components constituting the sensor unit. A temperature corrector corrects functions of the processing circuit according to the detection result provided from the temperature change detector.

18 Claims, 11 Drawing Sheets

PRIOR ART

FIG. 11
PRIOR ART

SEMICONDUCTOR DEVICE WITH TEMPERATURE COMPENSATION CIRCUIT

BACKGROUND OF THE INVENTION

1. Field of the Invention

The present invention relates to a semiconductor device and a temperature change detecting device. More particularly, the present invention relates to a semiconductor device including a processing circuit which needs temperature compensation to provide intended functions properly, and to a temperature change detecting device which detects changes in the temperature of an object of interest.

2. Description of the Related Art

It is known that the characteristics of electronic circuit components formed on a semiconductor substrate have some temperature dependence. On-chip resistors, for example, show variations in the resistance when the temperature changes. For this reason, the cutoff frequency of an active filter implemented on a semiconductor chip would vary with the substrate temperature if its temperature-sensitive elements were not corrected appropriately.

Figure 10:
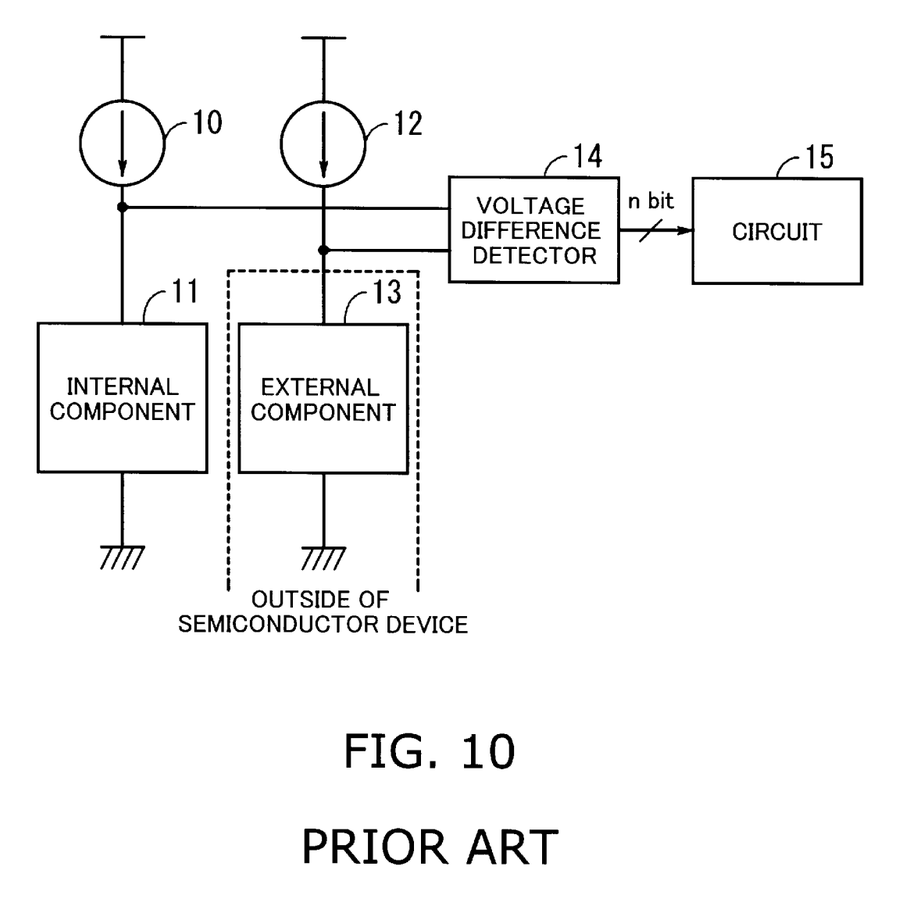
FIG. 10 shows an example of a temperature compensation circuit used in a conventional semiconductor device.

Researchers have proposed various temperature compensation methods to address the above problem. FIG. 10 shows a conventional compensation circuit where one such method is implemented. The illustrated circuit is composed of a first constant current source 10, an internal component 11, a second constant current source 12, an external component 13, a voltage difference detector 14, and a circuit 15 that needs temperature correction. These circuit elements are formed on a semiconductor device, except for the external component 13.

The first constant current source 10 supplies the internal component 11 with a constant current. The internal component 11 is, for example, a resistive element formed as part of the semiconductor device. The second constant current source 12 supplies the external component 13 with a constant current. The external component 13 is another resistive element placed outside of the semiconductor device so as not to be affected by the temperature of the device.

The voltage difference detector 14 senses the voltage difference between the internal component 11 and external component 13 and creates a n-bit signal representing that difference. This signal is supplied to the circuit 15 (e.g., active filter) which needs temperature compensation.

The circuit of FIG. 10 operates as follows. Upon power up, the first and second constant current sources 10 and 12 begin to supply a constant current to their respective load circuits 11 and 13, the former being located inside the device and the latter being located outside the device. Consider, for example, that the constant current sources 10 and 12, internal components 11, and external component 13 are designed to produce zero volts as a voltage difference between the upper nodes of the internal component 11 and external component 13 at room temperature (25 degrees Celsius). Since this condition holds during a certain period immediately after the device is powered up, the voltage difference detector 14 supplies the circuit 15 with a n-bit signal indicating that no voltage difference is detected. With this n-bit signal, the circuit 15 applies a prescribed signal processing function (e.g., filtering) to the given input signal with its default circuit parameters.

Suppose that a certain time has passed and the temperature of the semiconductor device has risen. While the temperature of the internal component 11 rises accordingly, the external component 13 located outside the semiconductor device stays at the same temperature. If the internal component 11 and external component 13 have a positive temperature coefficient (i.e., their resistances go up with temperature), the internal component 11 will exhibit a larger resistance than the external component 13. This means that the voltage developed across the internal component 11 will be greater than that of the external component 13 (assuming that the two constant current sources 10 and 12 output the same amount of current).

The voltage difference detector 14 now detects a non-zero voltage difference between the internal component 11 and external component 13 and creates a n-bit signal representing that difference for delivery to the circuit 15. Suppose that the voltage drop of the internal component 11 is 5.2 volts while that of the external component 13 is 5.1 volts. The voltage difference detector 14 then notifies the circuit 15 of the voltage difference by sending an n-bit signal representing that value, 0.1 volts.

The circuit 15 corrects itself with reference to the n-bit signal received from the voltage difference detector 14. Since it is 0.1 volts in the present example, the circuit 15 controls an integral resistive element in such a way that its resistance will be reduced to cancel out the temperature-induced increase. By doing so, the circuit 15 can maintain its own operating characteristics even if the device temperature is increased.

The conventional configuration explained above in FIG. 10, however, needs a mounting space for the external component 13 other than the semiconductor device itself. This is a disadvantage under some circumstances where the space limitation is tight. Another problem of the conventional circuit is that the output current of the constant current sources 10 and 12 may change with temperature because of the temperature dependence of circuit components used in them. This means that a measurement error would be introduced to the detected difference voltage.

Figure 11:
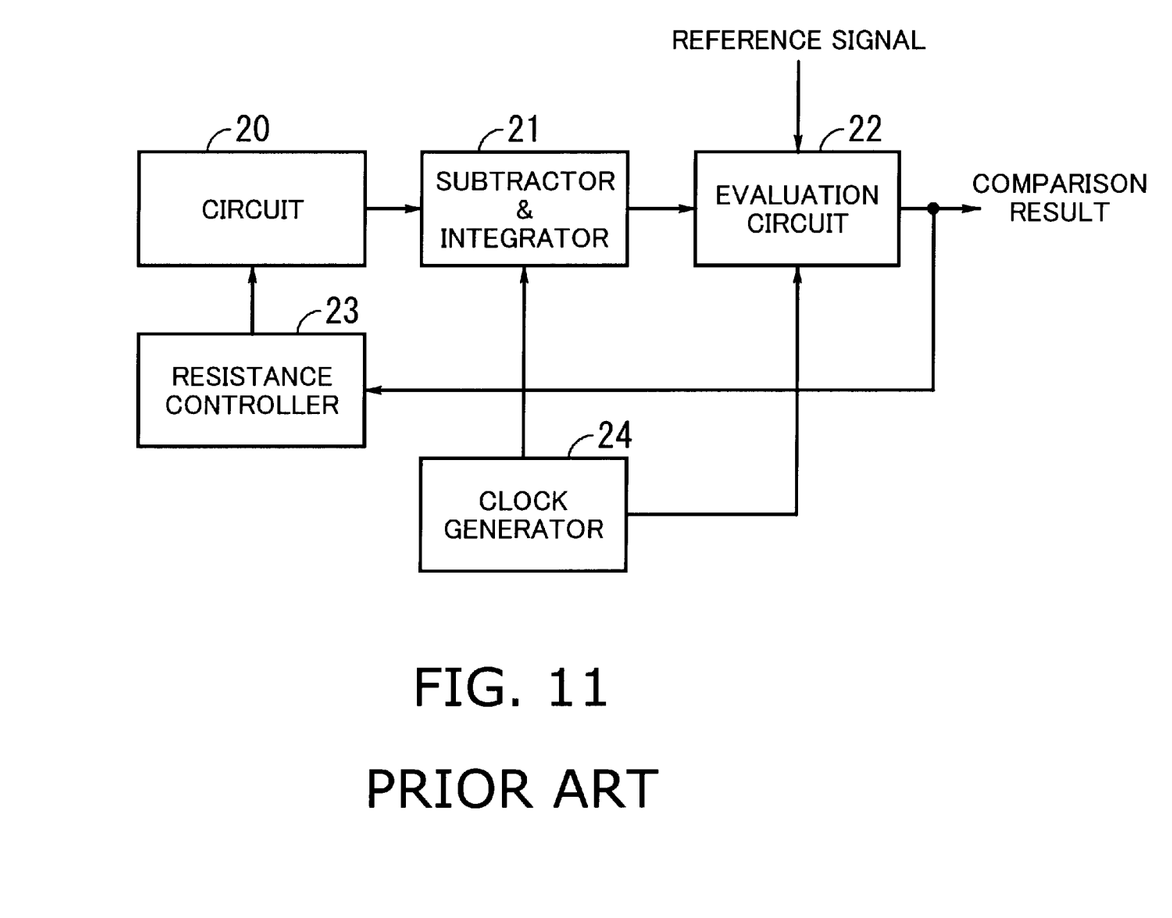
FIG. 11 shows another example of a temperature compensation circuit used in a conventional semiconductor device.

Referring next to FIG. 11, another example of a conventional temperature compensation method will be shown. The illustrated circuitry comprises a circuit 20, a subtractor & integrator 21, an evaluation circuit 22, a resistance controller 23, and a clock generator 24.

The circuit 20 is an active filter composed of resistors, capacitors, integrators, and other elements. The subtractor & integrator 21 integrates the voltage developed across one of the resistors in the circuit 20. It subtracts a DC offset from that voltage, if any, so as not to include such an offset in the result of integration.

The evaluation circuit 22 compares the output of the subtractor & integrator 21 with a predetermined reference signal and passes the result to the resistance controller 23. According to the comparison result, the resistance controller 23 controls the value of a certain resistive element that governs the characteristics of the circuit 20. The clock generator 24 provides the subtractor & integrator 21 and evaluation circuit 22 with a clock signal since they use switched-capacitor techniques.

The circuit of FIG. 11 operates as follows. When the semiconductor device is powered up, the circuit 20 starts to operate as an active filter. Timed with respect to the clock signal supplied from the clock generator 24, the subtractor & integrator 21 integrates the voltage developed across a particular resistor in the circuit 20 and sends the result to the evaluation circuit 22. The integration result contains no DC offset component of the voltage of interest because the subtractor & integrator 21 rejects it before integration.

The evaluation circuit 22 compares the output signal of the subtractor & integrator 21 with a predetermined reference signal and passes the result to the resistance controller 23. Suppose, for example, that these two signals agree with each other at room temperature (25 degrees Celsius). The evaluation circuit 22 then notifies the resistance controller 23 of the agreement between the two signals since the device temperature is almost the same as the ambient temperature just after power-up. While it is designed to modify the value of a certain resistive element in the circuit 20 according to the comparison result, the resistance controller 23 does nothing to the circuit 20 at the moment since the difference value has been observed to be zero.

As the time has passed after power-up, the temperature of the resistive element of interest goes up with the device temperature, causing a variation of the circuit parameter (i.e., resistance). This variation can be observed at the output of the subtractor & integrator 21. By comparing the output signal with a predetermined reference signal, the evaluation circuit 22 detects the variation and so notifies the resistance controller 23. The resistance controller 23 interprets it as a change in the resistance parameter in the circuit 20, thus modifying the internal setup of the circuit 20 to compensate for the variation. In the case the resistive element of interest has a positive temperature coefficient (i.e., the resistance increases as the temperature rises), the resistance controller 23 takes an action to reduce the resistance to compensate for the temperature increase. Through the above processing, the operating characteristics of its internal circuit 20 can be maintained even if the device temperature is increased.

The above-described conventional circuit of FIG. 11, however, exhibits some temperature dependence at one of its circuit blocks that produces the reference signal. This means that the reference signal may vary as the temperature changes, thus introducing an error to the temperature measurement.

SUMMARY OF THE INVENTION

In view of the foregoing, it is an object of the present invention to provide a semiconductor device with a temperature compensation circuit which detects temperature changes accurately, without requiring extra mounting space.

It is also an object of the present invention to provide a temperature change detecting device which detects temperature changes accurately, without requiring extra mounting space.

To accomplish the first object stated above, the present invention provides a semiconductor device comprising the elements that operate as follows. A processing circuit performs a predetermined function, which has some temperature dependence. A sensor unit is located in the vicinity of the processing circuit, which comprises a first and second semiconductor components having different temperature coefficients from each other. A temperature change detector detects a temperature change by observing a change in a certain property of the first and second semiconductor components constituting the sensor unit. A temperature corrector modifies a circuit parameter of the processing circuit to compensate for the temperature change detected by the temperature change detector.

To accomplish the second object stated above, the present invention provides a temperature change detecting device which detects changes in the temperature of an object of interest. This device comprises a sensor unit located in the vicinity of the object of interest, which comprises a first and second semiconductor components having different temperature coefficients from each other. A temperature change detector detects a temperature change by observing a change in a certain property of the first and second semiconductor components constituting the sensor unit.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiments of the present invention will be described below with reference to the accompanying drawings.

Figure 1:
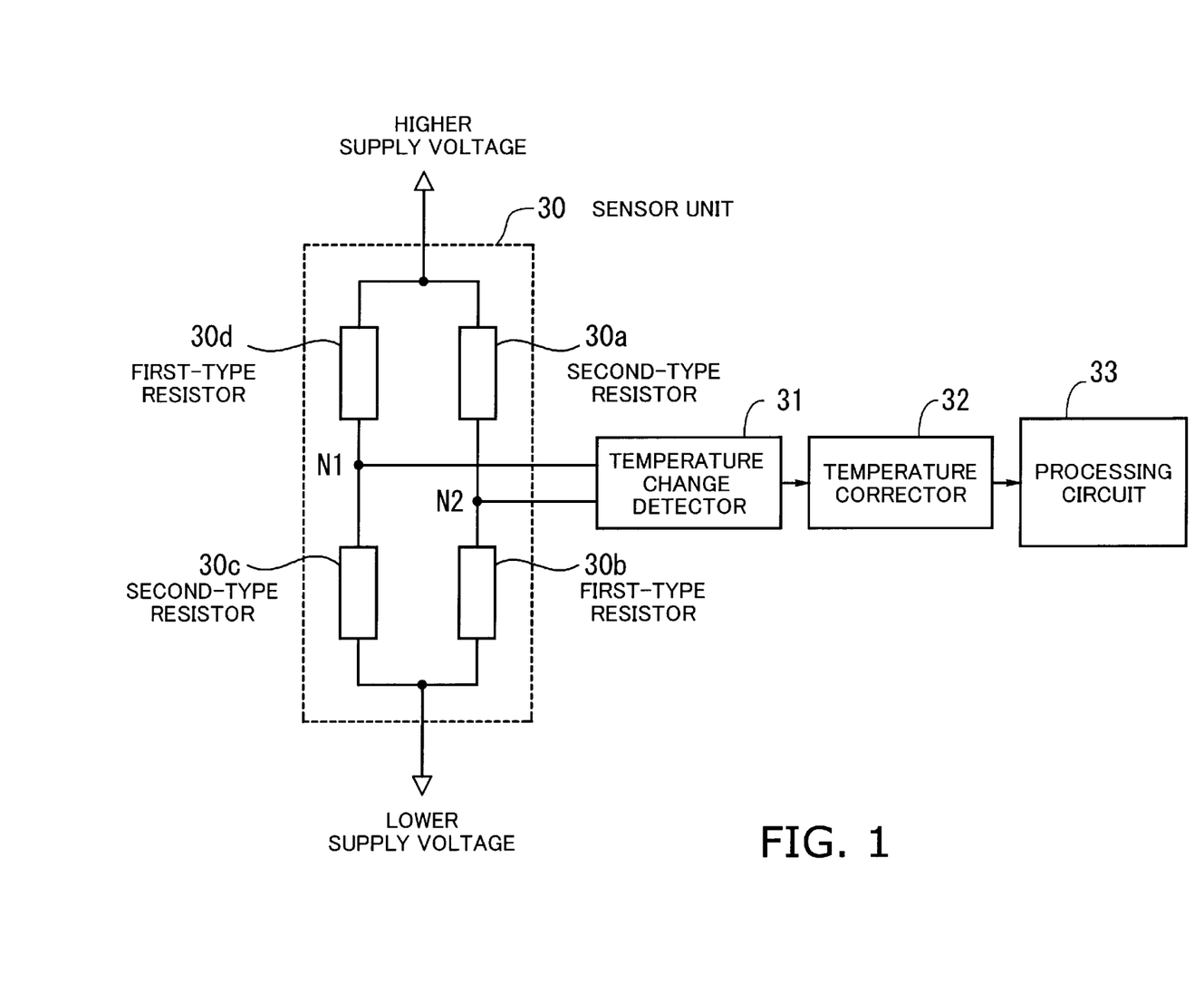
FIG. 1 is a conceptual view of the present invention.

FIG. 1 is a conceptual view of a semiconductor device according to the present invention. As seen, the proposed semiconductor device comprises the following elements: a sensor unit 30 (including first-type resistors 30b and 30d and second-type resistors 30a and 30c), a temperature change detector 31, a temperature corrector 32, and a processing circuit 33. Here, the processing circuit 33 is a circuit block which needs temperature correction.

The first-type resistors 30b and 30d have a temperature characteristic which is different from that of the second-type resistors 30a and 30c. Within the sensor unit 30, those four resistors 30a to 30d form a bridge circuit as follows. The upper leads of the second-type resistor 30a and first-type resistor 30d are connected to one supply voltage, while the lower leads of the first-type resistor 30b and second-type resistor 30c are connected to another supply voltage which is lower than the other one. Further, the first-type resistor 30d and second-type resistor 30c are connected in series, as are the second-type resistor 30a and first-type resistor 30b. The junction point of the former two resistors 30c and 30d is referred to herein as the node N1, and that of the latter two resistors 30a and 30b as the node N2. Voltages at these nodes N1 and N2 are led to the temperature change detector 31 for detection of their difference. By monitoring this voltage difference, the temperature change detector 31 senses temperature changes at the processing circuit 33 which has some temperature dependence and thus needs appropriate compensation.

The temperature corrector 32 receives the result of temperature detection from the temperature change detector 31 and corrects the operation of the processing circuit 33 accordingly. The processing circuit 33 uses the output of the temperature corrector 32 to modify, for example, the resistance of its integral resistive element in such a way that the outcome of the processing circuit 33 will not be affected by any temperature changes.

The above circuitry will operate as follows. When the semiconductor device of FIG. 1 is powered up, its power supply circuit (not shown) begins to energize the sensor unit 30. It is supposed here that all the four resistors 30a to 30d are designed to have the same resistance at room temperature. Since the temperature of the semiconductor device is very close to the ambient temperature (room temperature) in such an initial period after power up, the bridge circuit is in a balanced state. Thus the sensor unit 30 outputs zero volts, indicating no voltage difference between the nodes N1 and N2.

Since no voltage difference is found between the nodes N1 and N2, the temperature change detector 31 determines that the semiconductor device is operating at room temperature, and it so informs the temperature corrector 32. The temperature corrector 32 thus recognizes the current operating condition as being normal. Because there is no need to provide compensation to the processing circuit 33 operating at room temperature, the temperature corrector 32 does nothing at the moment.

The temperature of the semiconductor device rises with time, which causes the proposed circuit to work as follows. As mentioned earlier, the two groups of resistors in the sensor unit 30 have different temperature characteristics. More specifically, suppose that the first-type resistors 30b and 30d have a positive temperature coefficient (i.e., the resistance increases with temperature), whereas the second-type resistors 30a and 30c have a negative temperature coefficient (i.e., the resistance decreases as the temperature rises).

Because of their different temperature-resistance coefficients, the increased temperature makes the first-type resistors 30b and 30d show a greater voltage drop and the second-type resistors 30a and 30c exhibit a smaller voltage drop. As a result of this difference, the voltage at the second node N2 becomes higher than the voltage at the first node N1. The temperature change detector 31 observes this voltage difference and interprets it as a temperature increase with respect to room temperature. The temperature change detector 31 thus outputs to the temperature corrector 32 a detection signal proportional to the detected voltage difference.

Upon receipt of the notification, the temperature corrector 32 corrects a certain circuit parameter of the processing circuit 33 so as to make the characteristics of the processing circuit 33 independent of the temperature increase. Suppose, for example, that the processing circuit 33 contains a resistor with a positive temperature coefficient, and it dominates the characteristics of the processing circuit 33 as a whole. Since this resistor shows a larger resistance as the temperature rises, the temperature corrector 32 manipulates that resistor to reduce its value or takes an indirect measure to bring about the equivalent effect, thereby canceling out the increase of resistance. As a result of such temperature compensation, the processing circuit 33 will be able to operate without changing its characteristics or performance, despite the temperature increase.

The ambient temperature may in turn drop below 25 degrees Celsius, the nominal room temperature, which actually happens when, for example, a person has brought the device to a room in which an air conditioner is working. In such a case, the device temperature goes down, causing the voltage at the first node N1 to become higher than the second node N2. The temperature corrector 32 then manipulates the resistor in the processing circuit 33 in such a way that its resistance will be reduced. In this way, the temperature corrector 32 prevents the characteristics of the processing circuit 33 from being affected by a temperature drop.

As seen from the above explanation, the present invention provides a semiconductor device including first-type resistors 30b and 30d and second-type resistors 30a and 30c to detect temperature variations. Compared to the conventional circuit discussed in FIG. 10, the proposed temperature compensation circuit is advantageous in its smaller mounting space, because no external component is needed.

Also, according to the present invention, the proposed semiconductor device uses a bridge circuit composed of the first-type resistors 30b and 30d and second-type resistors 30a and 30c having different temperature characteristics in order to detect temperature changes. In terms of the accuracy of measurement, the proposed temperature detection circuit has the advantage over the conventional circuits shown in FIGS. 10 and 11 as will be discussed below.

Recall that the conventional circuit of FIG. 10 has a second constant current source 12 to provide a current to an external component 13. This current, however, exhibits some dependence on the temperature. Consider here that the external component 13 has a resistance of R. Then a variation $\Delta I$ of the current source output will be observed as a change in the voltage across the external component 13. The magnitude of this change (or error) is expressed as $\Delta I \times R$, which means that the voltage difference detector 14 receives R times the temperature-induced current variation $\Delta I$ as an error.

Unlike the conventional circuit, the proposed circuit of FIG. 1 employs an advantageous sensor unit 30 which is insensitive to variations in its supply voltage as long as the bridge circuit is balanced. This is because no voltage appears at the differential output of the bridge circuit in balanced state, regardless of the supply voltage. When the bridge circuit becomes slightly off balance, a variation $\Delta V$ in the supply voltage would lead to an error in the output of the bridge circuit. The amount of this error, however, is only $\Delta V/(R1+R2)$, where R1 is the value of the first-type resistors 30b and 30d, and R2 is the value of the second-type resistors 30a and 30c. This means that the temperature change detector 31 receives $1/(R1+R2)$ times the supply voltage variation $\Delta V$. That is, the proposed circuit is much less sensitive to supply voltage variations, compared to the conventional circuit of FIG. 10.

Figure 2:
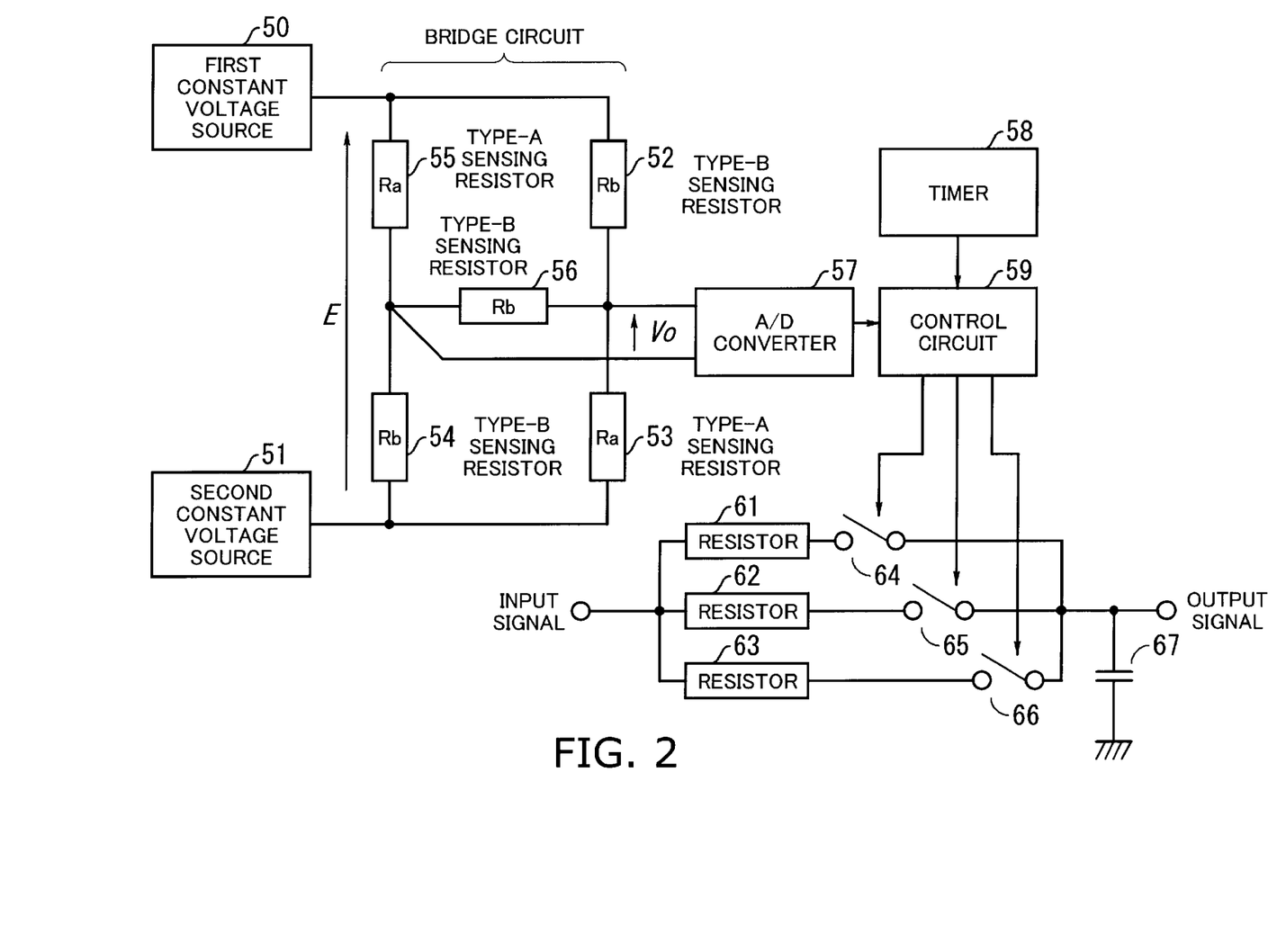
FIG. 2 is a block diagram of a first embodiment of the present invention.

Referring next to FIG. 2, a more specific embodiment of the present invention will be explained below. FIG. 2 is a block diagram of a first embodiment of the present invention. The illustrated embodiment comprises the following elements: a first and second constant voltage sources 50 and 51, a type-B sensing resistor 52, a type-A sensing resistor 53, another type-B sensing resistor 54, another type-A sensing resistor 55, yet another type-B sensing resistor 56, an analog-to-digital (A/D) converter 57, a timer 58, a control circuit 59, resistors 61 to 63, switches 64 to 66, and a capacitor 67.

The first and second constant voltage sources 50 and 51 are responsible for producing predetermined levels of voltages from a voltage supplied to the semiconductor device. The produced voltages are fed to one pair of opposite nodes of the bridge circuit composed of the resistors 52 to 56.

Figure 3:
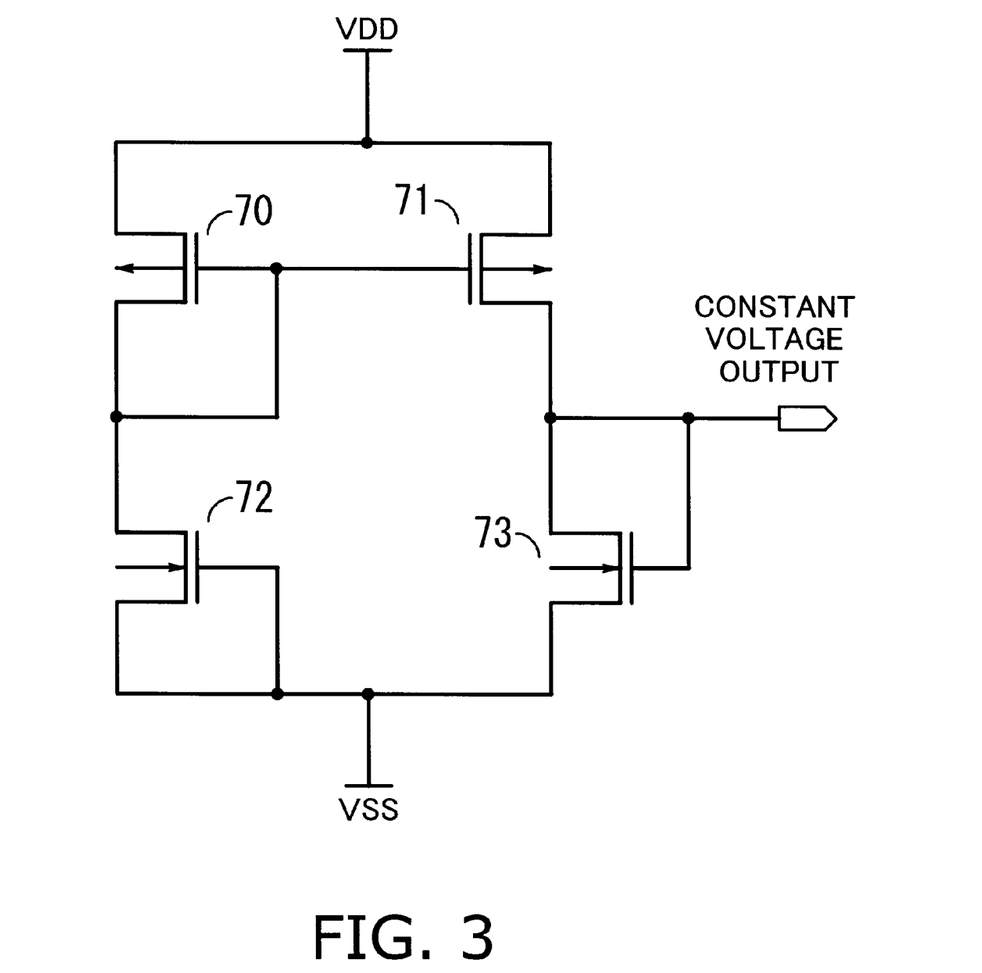
FIG. 3 shows the details of constant voltage sources shown in FIG. 2.

FIG. 3 shows the details of the first and second constant voltage sources 50 and 51 shown in FIG. 2. As seen from this diagram, the first and second constant voltage sources 50 and 51 each comprises the following components: two p-channel metal oxide semiconductor field effect transistors (MOS-FETs) 70 and 71 and two n-channel MOS-FETs 72 and 73. The circuit produces a predetermined voltage from a higher supply voltage VDD and a lower supply voltage VSS for delivery to the bridge circuit.

Referring back to FIG. 2, the type-A sensing resistors 53 and 55 have a different temperature coefficient from that of the type-B sensing resistors 52, 54, and 56. They are placed together in the vicinity of resistors 61 to 63 which should be controlled by temperature. The structure of such sensing resistors will now be explained below.

Figure 4:
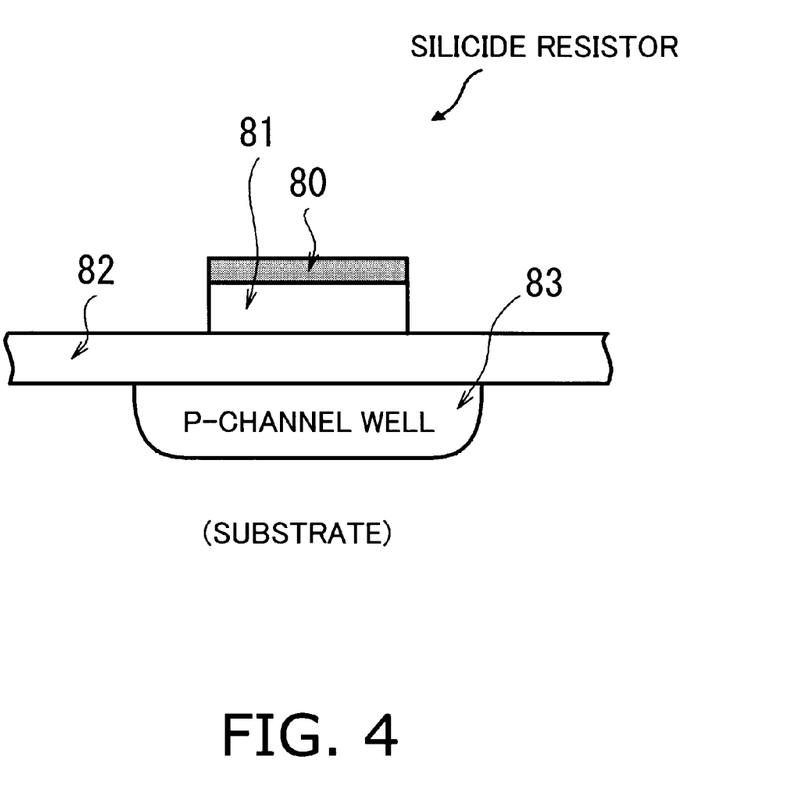
FIG. 4 shows the detailed structure of a type-A sensing resistor shown in FIG. 2.

FIG. 4 shows the details of the type-A sensing resistors 53 and 55. As seen from this diagram, the type-A sensing resistors 53 and 55 are silicide resistors formed on a semiconductor substrate, each being composed of a silicide layer 80, a polysilicon layer 81, an oxide film 82, and a p-channel well 83.

Figure 5:
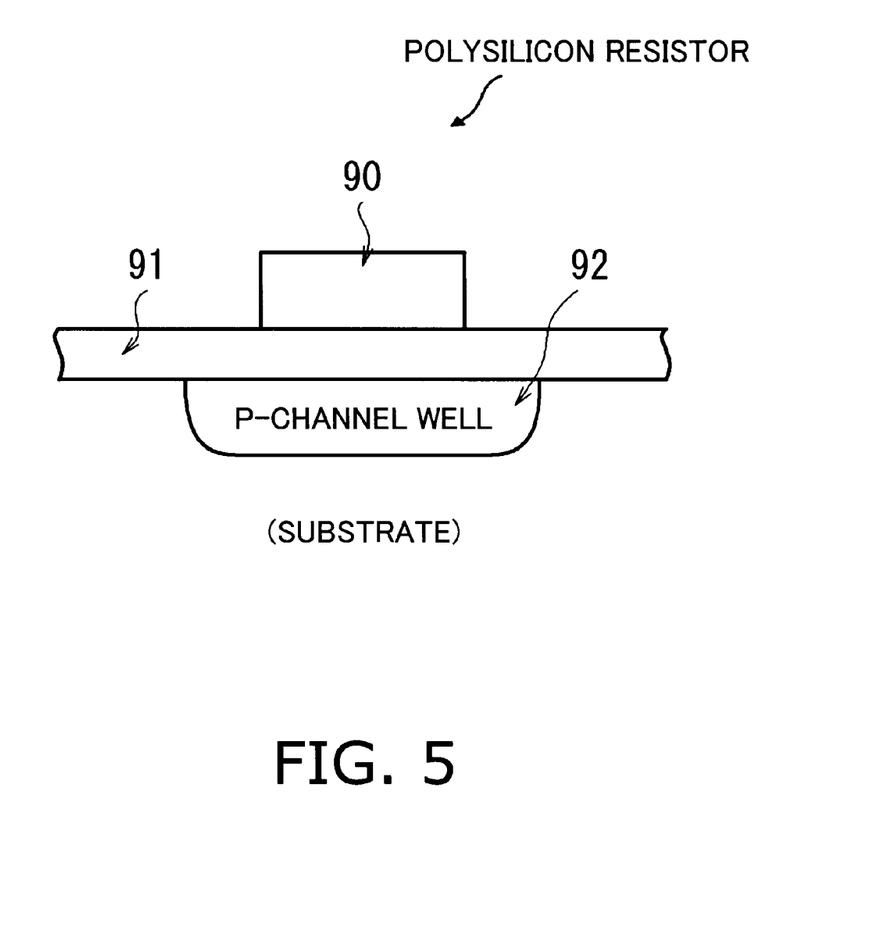
FIG. 5 shows the detailed structure of a type-B sensing resistor shown in FIG. 2.

FIG. 5 shows the details of the type-B sensing resistors 52, 54, and 56. As seen from this diagram, the type-B sensing resistors 52, 54, and 56 are polysilicon resistors formed on a semiconductor substrate, each being composed of a polysilicon layer 90, an oxide film 91, and a p-channel well 92. As seen from FIGS. 4 and 5, the two kinds of on-chip resistors have similar structures except that the silicide resistor of FIG. 4 has a silicide layer 80 on the polysilicon layer 81.

Figure 6:
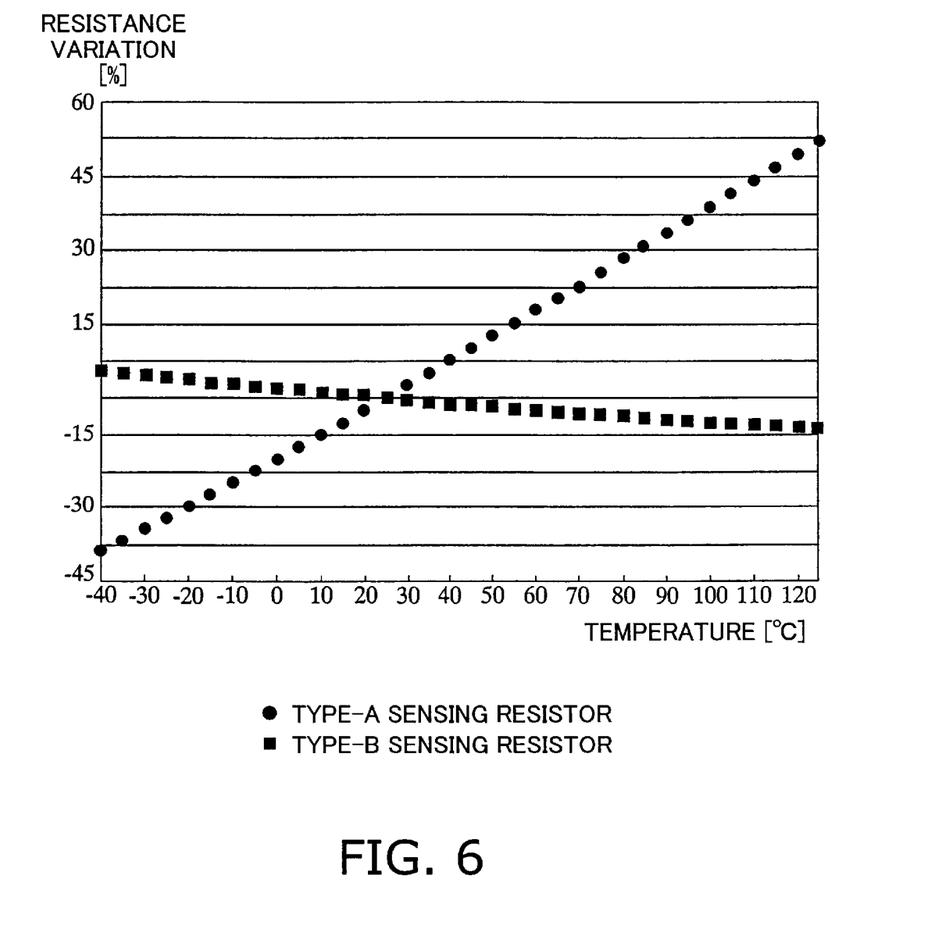
FIG. 6 shows an example of temperature characteristics of type-A and type-B sensing resistors.

FIG. 6 shows typical temperature characteristics of the type-A sensing resistors 53 and 55 and type-B sensing resistors 52, 54, and 56. In this graph, the solid circles represent the characteristic of type-A sensing resistors (silicide resistors), and the solid boxes represent that of type-B sensing resistors (polysilicon resistors). Type-A sensing resistors have a positive temperature coefficient, the resistance of which increases linearly as the temperature rises. Type-B sensing resistors, on the other hand, have a negative temperature coefficient, showing a nonlinear curve of resistance which gradually decreases with temperature.

Referring back to the block diagram of FIG. 2, the A/D converter 57 receives analog output signals from the bridge circuit and converts them into digital form. The timer 58 counts time and sends a timing signal to the control circuit 59 at a predefined time of day or when a predetermined time has elapsed since a particular time point. The control circuit 59 is constructed with, for example, a central processing unit (CPU), read-only memory (ROM) devices, and random access memory (RAM) devices. Being triggered by the timer 58, it controls the switches 64 to 66 according to the digital signals provided from the A/D converter 57.

The resistors 61 to 63 are connected to one capacitor 67 through the switches 64 to 66 which are interposed in series with them. A simple resistor-capacitor (RC) filter with a certain cutoff frequency will be formed by that capacitor 67 and (at least) one of the resistors 61 to 63 when its corresponding switch 64 to 66 is turned on. The switches 64 to 66 are semiconductor switches whose on/off state is determined by the control circuit 59.

According to the first embodiment, the proposed semiconductor device operates as follows. When the device is powered up, the first and second constant voltage sources 50 and 51 are energized by the higher power supply VDD and lower power supply VSS (FIG. 3). The two voltage sources 50 and 51 thus start applying predetermined voltages to the bridge circuit. The voltage developed across the central type-B sensing resistor 56 is referred to as the output voltage Vo of the bridge circuit, which is given by:

$$Vo = E \cdot (Ra - Rb)/(3 \cdot Ra + Rb) \qquad (1)$$

where Ra is the resistance of the type-A sensing resistors 53 and 55, Rb is the resistance of the type-B sensing resistors 52, 54, and 56, and E represents the supply voltage applied to the bridge circuit.

Figure 7:
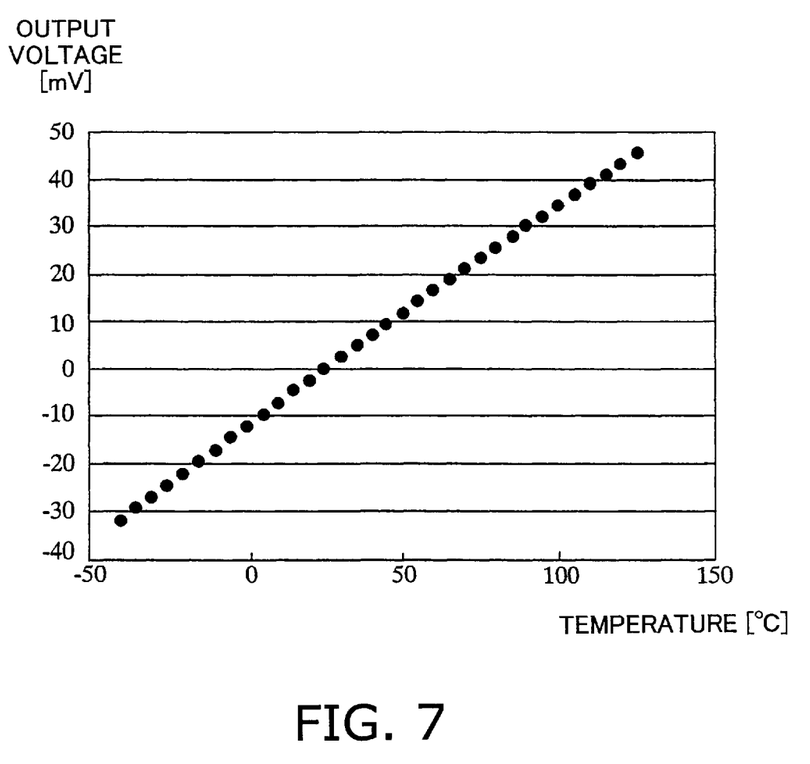
FIG. 7 shows a temperature response of the bridge circuit shown in FIG. 2.

FIG. 7 shows the relationship between the temperature and the output voltage Vo of the bridge circuit. As this graph shows, the output voltage Vo increases with temperature. Suppose that the device is designed such that the resistances Ra and Rb agree with each other at room temperature (25 degrees Celsius). Then the illustrated bridge circuit is expected to output zero volts when the power is turned on, because the temperature of the device (including the resistors 61 to 63 of interest) is supposed to be almost equal to room temperature at the time of power up, and the numerator of the fractional expression (1) is zero at that temperature. The A/D converter 57 converts this zero-volt signal into a digital code representing "zero" and passes it to the control circuit 59. The control circuit 59 takes this code as an indication of room temperature (25 degrees Celsius). It therefore turns on the first switch 64 that is associated with the code "zero," while leaving the other switches 65 and 66 in the off state. The selected resistor 61 and the capacitor 67 now serve as an RC filter which rejects high spectral components of a given input signal above its cutoff frequency.

The timer 58 sends out a timing signal when a predetermined time (e.g., three minutes) has elapsed since power-up, causing the control circuit 59 to take another sample of the output of the A/D converter 57. This action is based on the following reason. The temperature of the semiconductor device of FIG. 2 goes up with the passage of time after power-up. This affects the resistance of the resistor 61, leading to a variation in the cutoff frequency of the RC filter composed of the resistor 61 and capacitor 67. In the case the resistor 61 is a silicide resistor similar to the type-A sensing resistors 53 and 55, its resistance increases with temperature as shown in FIG. 6, meaning that the cutoff frequency decreases as the temperature rises. To detect such a temperature change, the control circuit 59 checks the output of the A/D converter 57 when the timer 58 indicates that a predetermined time has passed since power-up. If a temperature increase is observed, the control circuit 59 manipulates the switches 64 to 66 in an appropriate manner, so that the cutoff frequency of the RC filter will not change.

Figure 8:
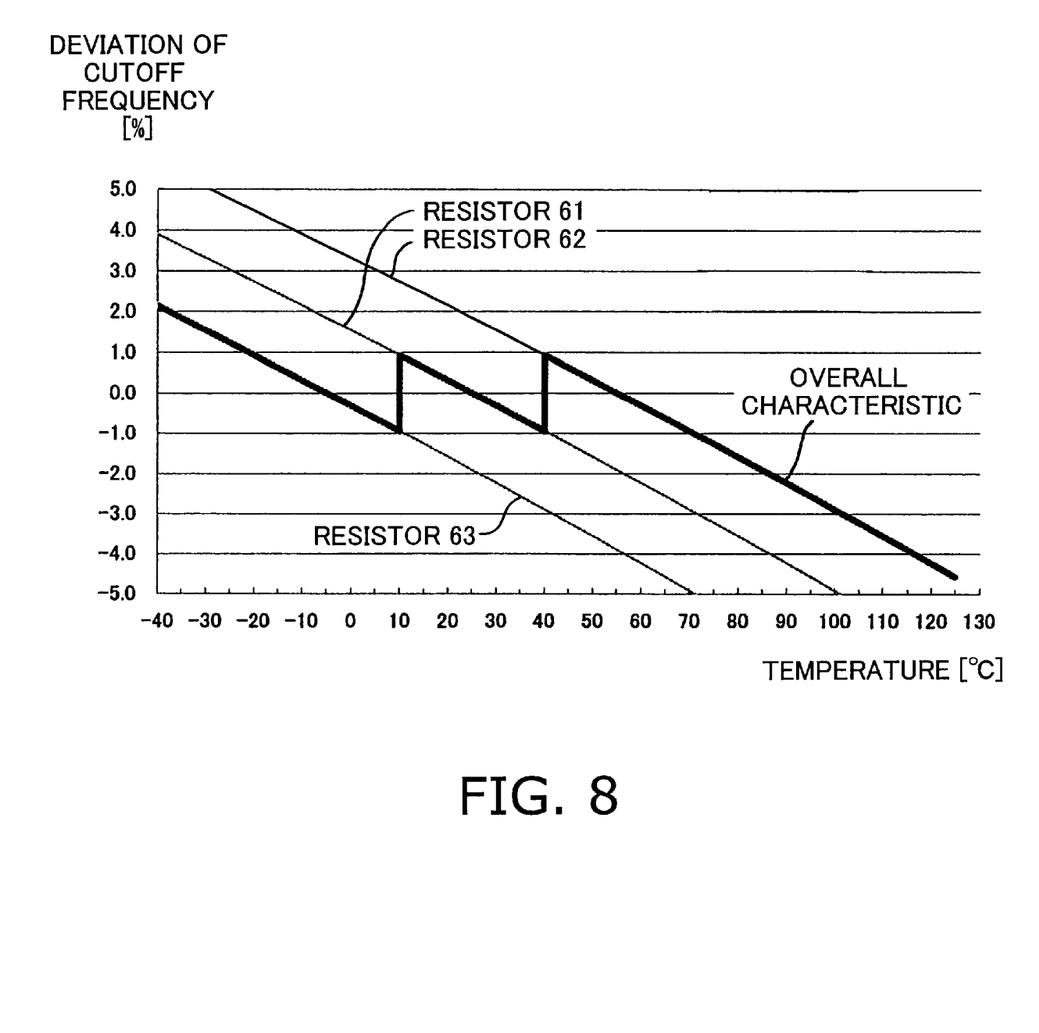
FIG. 8 shows the relationship between the temperature of the proposed semiconductor device of FIG. 2 and the deviation of its cutoff frequency.

FIG. 8 shows the relationship between the temperature of the proposed semiconductor device of FIG. 2 and the deviation of its cutoff frequency. This graph shows three downward lines representing the temperature characteristics of cutoff frequency. The central line indicates the case where the first resistor 61 is connected with the capacitor 67. The upper line indicates the case where the second resistor 62 is connected with the capacitor 67. The lower line indicates the case where the third resistor 63 is connected with the capacitor 67.

The proposed circuit of FIG. 2 compensates for temperature changes through the combined use of those three characteristics as indicated by the bold line in FIG. 8. That is, the first resistor 61 is selected in the central temperature range of 10 to 40 degrees Celsius; the second resistor 62 is selected in the high temperature range above 40 degrees Celsius; and the third resistor 63 is selected in the low temperature range below 10 degrees Celsius.

Suppose in the present example that the current temperature is 50 degrees. In this situation, the bridge circuit outputs about 10 mV as seen from FIG. 7. The control circuit 59 recognizes this voltage from the output of the A/D converter 57 and thus turns on the second switch 65 while leaving the other switches in off state. (The control circuit 59 may have a lookup table in its internal ROM for the purpose of determining which switch to select when a specific bridge voltage is given.) As a result of the above selection, the second resistor 62 and capacitor 67 form an RC filter for filtering out the low frequency components of a given input signal.

The above-described first embodiment of the present invention reduces the temperature dependence of the RC filter, controlling the deviation of its cutoff frequency not to exceed one percent of its nominal value as long as the device's temperature is within the range of −20 to 70 degrees Celsius.

It is another advantageous feature of the present embodiment that the sensing resistors 52 to 56 can be located close to the resistors 61 to 63, the objects to be temperature-corrected. Besides making accurate measurement possible, the proposed device requires no off-chip components, thus enabling efficient use of board space.

Still another distinct feature of the present embodiment is the use of a bridge circuit composed of resistors having different temperature coefficients. This bridge circuit minimizes the effect of supply voltage fluctuations which could introduce an error in temperature measurement.

As already seen, the bridge circuit in the first embodiment employs a type-B sensing resistor 56, across which the output voltage is sensed. The presence of this resistor 56 actually alleviates the effect of nonlinear characteristic of type-B resistors in the bridge circuit. More specifically, the bridge output voltage Vo would be given by the following equation, if a type-A resistor was used in place of the type-B sensing resistor 56.

$$Vo=E \cdot (Ra-Rb)/(3 \cdot Rb+Ra) \quad (2)$$

Compare this equation (2) with the previous one (1). Then it would be noticed that the denominator (3·Ra+Rb) on the right-hand part of the equation (1) implies that Ra are more dominant than Rb, whereas (3·Rb+Ra) of the equation (2) indicates the opposite. That is, the bridge output Vo is governed by the characteristics of type-A sensing resistors which give a linear response to temperature changes, and this explains why the bridge circuit exhibits a good linearity in FIG. 7.

As seen from the above discussion, when a bridge circuit is constructed with a combination of linear resistors and nonlinear resistors, the use of a nonlinear sensing resistor to connect its output nodes would improve the linearity of the bridge circuit as a whole. The structure of the subsequent control circuit 59 can be simplified by linearizing the bridge circuit in this way.

Figure 9:
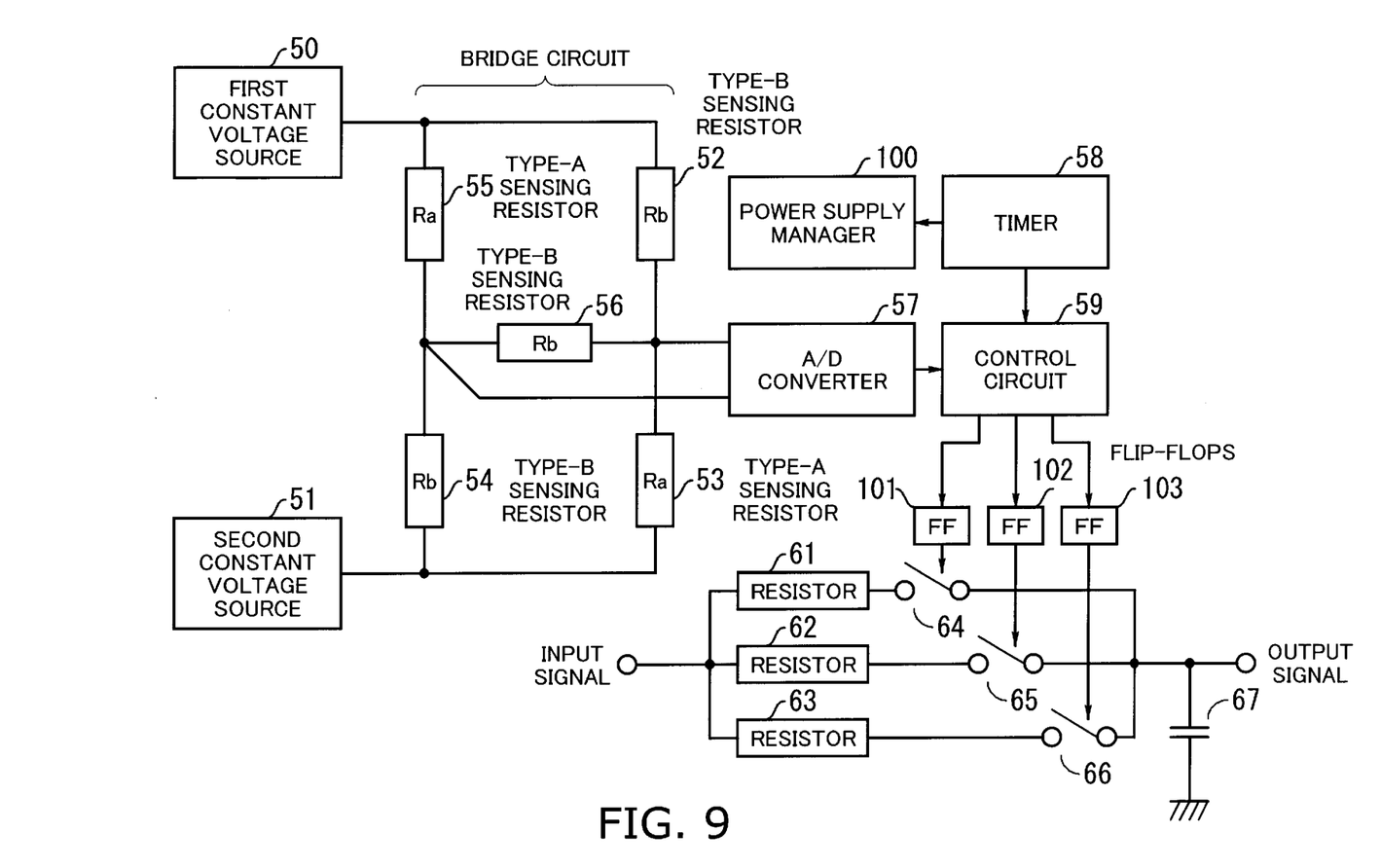
FIG. 9 is a block diagram of a second embodiment of the present invention.

Referring next to FIG. 9, another embodiment of the present invention will be explained below.

FIG. 9 is a block diagram of a semiconductor device with a temperature compensation circuit according to a second embodiment of the present invention. Because of the similarity between FIG. 2 and FIG. 9, the following explanation will concentrate on the second embodiment's distinctive features, while affixing like reference numerals to like elements. Actually, the second embodiment is different from the first embodiment in that a power supply manager 100 and flip-flops (FFs) 101 to 103 are added (the other elements are identical to those explained in FIG. 2).

The power supply manager 100 permits the operating power to be supplied to two constant voltage sources 50 and 51, A/D converter 57, and control circuit 59 when the device is powered up, or when the timer 58 indicates that a predetermined time has elapsed since power up. It stops the power supply otherwise.

The flip-flops 101 to 103 sample the control outputs of the control circuit 59 at some particular timings and hold them for use by the switches 64 to 66. Since they are always powered, these flip-flops 101 to 103 can maintain the state of the switches 64 to 66 even when the control circuit 59 is not energized.

The second embodiment operates as follows. When a supply power is applied to the semiconductor device of FIG. 9, the power supply manager 100 becomes active and begins supplying power to the first and second constant voltage sources 50 and 51, A/D converter 57, and control circuit 59. The bridge circuit outputs a voltage signal to the A/D converter 57 which indicates a temperature change at the resistors 61 to 63 of interest. The A/D converter 57 converts this signal into a digital code and passes it to the control circuit 59.

Considering the present temperature identified from the output of the A/D converter 57, the control circuit 59 determines which switch to turn on. Suppose, for example, that the control circuit 59 asserted the leftmost control signal to activate the first switch 64. This means that the output of the flip-flop 101 goes high, while the other flip-flops 102 and 103 remain in the low state. The flip-flops 101 to 103 hold such outputs of the control circuit 59 for use by the switches 64 to 66. The first resistor 61 selected through the activated switch 64 is now combined with the capacitor 67, thus functioning as an RC filter which rejects spectral components above its cutoff frequency from the given input signal.

When a certain time has passed since power-up (or since the last issuance of control signals from the control circuit 59), the power supply manager 100 recognizes it from the timer 58 and interrupts the power supply. The two constant voltage sources 50 and 51, A/D converter 57, and control circuit 59 are de-energized accordingly.

When another predetermined time (e.g., three minutes) has passed since the above power interruption, the power supply manager 100 recognizes it from the timer 58 and restarts the power supply. The two constant voltage sources 50 and 51, A/D converter 57, and control circuit 59 are energized again and thus begin to update the on/off state of each switch 64 to 66 in the same way as described earlier. In this way, the cutoff frequency of the RC filter is kept within a prescribed range even when the temperature rises. Although the power supply manager 100 may stop supplying the power again, the latest state of the switches 64 to 66 are retained in the flip-flops 101 to 103, which are always powered.

As seen from the above explanation, the second embodiment of the present invention saves power by energizing most part of the temperature compensation circuit only when it is really needed. The power is otherwise consumed solely by the flip-flops 101 to 103 to maintain the current state of the switches 64 to 66.

In the two embodiments of the present invention, the bridge circuit employs a type-B sensing resistor 56 at its output nodes to improve the linearity. It is, however, not necessarily required when the type-B sensing resistor 56 has a linear temperature characteristic.

While the illustrated RC filter provides for a plurality of resistors for the purpose of cutoff frequency control, it is also possible to construct a similar filter with a plurality of capacitors, instead of resistors. If this is the case, the control circuit would select a particular capacitor by turning on the switch associated with it, according to the output of the A/D converter.

As another way of controlling the RC filter, two or more resistors 61 to 63 may be selected at a time. Even if a small number of resisters are available, it is possible to realize a variety of resistance values by combining two or more resistors as required.

While both the two embodiments have assumed an RC filter as the object that needs compensation, it is not intended to limit the invention to this specific application. Rather, the present invention can be applied to any kinds of temperature-sensitive electronic circuits.

In the above-described embodiments, a bridge circuit implemented on a semiconductor device is used to control other circuits on the same chip. The output of such a bridge circuit may also be used by some other devices or circuits outside the proposed device. For this purpose, the device may have an interface and terminals through which the bridge signals are sent out.

The bridge circuit described in the above embodiments is composed of resistive elements. The present invention, however, should not be limited to this specific type of elements, but can also be implemented with other types of elements.

Further, the present invention is not limited to the configuration employing a bridge circuit to detect temperature changes. Other circuits constructed with a plurality of elements having different temperature characteristics may also be used as a sensor unit in the proposed device. Temperature changes will be detected by observing the current flowing into such an element, or by measuring the voltage developed across such an element.

The above discussion is summarized as follows. According to the present invention, the proposed semiconductor device has the following elements. A processing circuit performs a predetermined function. A sensor unit is located in the vicinity of the processing circuit, which comprises a first and second semiconductor components having different temperature coefficients from each other. A temperature change detector detects temperature changes by observing a change in a certain property of the first and second semiconductor components constituting the sensor unit. A temperature corrector then modifies a circuit parameter of the processing circuit to compensate for the temperature change detected by the temperature change detector. This structural arrangement makes it possible to detect the temperature of a temperature-sensitive processing circuit more accurately, without requiring extra mounting space, and also to correct the characteristics of the processing circuit according to the detected values.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   (a) a processing circuit which performs a predetermined function;
   (b) a sensor unit located in the vicinity of said processing circuit, comprising:
       a plurality of first-type semiconductor components, and
       a plurality of second-type semiconductor components having a temperature coefficient different from that of said first-type semiconductor components, said first-type semiconductor components and said second-type semiconductor components forming a bridge circuit;
   (c) a temperature change detector which detects a temperature change by observing a change in said bridge circuit; and
   (d) a temperature corrector which modifies a circuit parameter of said processing circuit to compensate for the temperature change detected by said temperature change detector.

2. The semiconductor device according to claim 1, wherein
   said first-type semiconductor components are first-type resistive elements;
   said second-type semiconductor components are second-type resistive elements having a temperature coefficient different from that of said first-type resistive elements, and
   said temperature change detector detects the temperature change at said processing circuit by observing output voltage of the bridge circuit.

3. The semiconductor device according to claim 2, wherein:
   said second-type resistive elements have a nonlinear temperature characteristic; and
   said bridge circuit comprises another resistive element located at an output portion thereof, which has the same nonlinear temperature characteristic as said second-type resistive elements have.

4. The semiconductor device according to claim 1, wherein said temperature corrector is activated when the semiconductor device is powered up.

5. The semiconductor device according to claim 1, wherein said temperature corrector is activated at predetermined intervals.

6. The semiconductor device according to claim 1, further comprising:
   a memory circuit which records the temperature change detected by said temperature change detector; and
   a supply power controller which controls a supply voltage to said sensor unit and said temperature change detector,
   wherein said supply power controller permits the supply voltage to be fed to said sensor unit and said temperature change detector only when said temperature corrector is activated, and
   wherein said temperature corrector operates with reference to the temperature change recorded in the memory circuit, when said supply power controller stops feeding the supply voltage to said sensor unit and said temperature change detector.

7. The semiconductor device according to claim 1, wherein said first semiconductor component has a positive temperature coefficient, and said second semiconductor component has a negative temperature coefficient.

8. A temperature change detecting device which detects changes in the temperature of an object, comprising:
   a sensor unit located in the vicinity of the object, comprising:
       a plurality of first-type semiconductor components, and
       a plurality of second-type semiconductor components having a temperature coefficient different from that of said first-type semiconductor components, said first-type semiconductor components and said second-type semiconductor components forming a bridge circuit; and
   a temperature change detector which detects a temperature change by observing a change in said bridge circuit.

9. The temperature change detecting device according to claim 8, wherein:
   said first semiconductor component includes first-type resistive elements;

said second semiconductor component includes second-type resistive elements having a temperature coefficient different from that of said first-type resistive elements;

said sensor unit includes a bridge circuit formed by said first-type and second-type resistive elements; and said temperature change detector detects the temperature change at said object by observing output voltages of the bridge circuit.

10. The temperature change detecting device according to claim 9, wherein:

said second-type resistive elements have a nonlinear temperature characteristic; and said bridge circuit comprises another resistive element located at an output portion thereof, which has the same nonlinear temperature characteristic as said second-type resistive elements have.

11. A semiconductor device comprising:

(a) a processing circuit which performs a predetermined function;

(b) a bridge circuit located in the vicinity of said processing circuit, comprising:

a first semiconductor component, one end of which is connected to a first constant voltage source, a second semiconductor component having a temperature coefficient different from that of said first semiconductor component, one end of which is connected to the other end of said first semiconductor component, and the other end of which is connected to a second constant voltage source, a third semiconductor component having the same temperature coefficient as that of said second semiconductor component, one end of which is connected to the first constant voltage source, and a fourth semiconductor component having the same temperature coefficient as that of said first semiconductor component, one end of which is connected to the other end of said third semiconductor component, and the other end of which is connected to the second constant voltage source;

(c) a temperature change detector which detects a temperature change by observing a change in a voltage difference between a first and second nodes of said bridge circuit, the first node being a junction point of said first and second semiconductor components, the second node being a junction point of said third and fourth semiconductor components; and (d) a temperature corrector which corrects the function of said processing circuit to compensate for the temperature change detected by said temperature change detector.

12. The semiconductor device according to claim 11, wherein said first to fourth semiconductor components are resistive elements.

13. The semiconductor device according to claim 12, wherein:

said second and third semiconductor components have a nonlinear temperature characteristic; and said bridge circuit further comprises a fifth semiconductor component located between said first and second nodes, which has the same nonlinear temperature characteristic as said second and third semiconductor components have.

14. The semiconductor device according to claim 11, wherein said first semiconductor component has a positive temperature coefficient, and said second semiconductor component has a negative temperature coefficient.

15. A semiconductor device comprising:

(a) a filter comprising a resistor section and a capacitor section, said filter having a cutoff frequency determined by the resistance of said resistor and the capacitance of said capacitor;

(b) a sensor unit located in the vicinity of said filter, comprising:

a plurality of first-type semiconductor components, and a plurality of second-type semiconductor components having a temperature coefficient different from that of said first-type semiconductor components, said first-type semiconductor components and said second-type semiconductor components forming a bridge circuit; and (c) a temperature change detector which detects a temperature-induced variation in the resistance of said resistor section and/or in the capacitance of said capacitor section by observing a change in said bridge circuit; and (d) a temperature corrector which makes a correction to said filter according to the temperature-induced variation detected by said temperature change detector, by varying at least one of the resistance of said resistor section and the capacitance of said capacitor section.

16. The semiconductor device according to claim 15, wherein:

said resistor section comprises:

a plurality of resistors, and a plurality of switches each coupled to one of said plurality of resistors, the state of which is controlled by said temperature corrector; and said temperature corrector turns on at least one of said plurality of switches according to the temperature-induced variation detected by said temperature change detector, thereby selecting at least one of said plurality of resistors corresponding thereto and varying the resistance of said resistor section.

17. The semiconductor device according to claim 15, wherein:

said capacitor section comprises:

a plurality of capacitors, and a plurality of switches each coupled to one of said plurality of capacitors, the state of which is controlled by said temperature corrector; and said temperature corrector turns on at least one of said plurality of switches according to the temperature-induced variation detected by said temperature change detector, thereby selecting at least one of said plurality of capacitors corresponding thereto and varying the capacitance of said capacitor section.

18. The semiconductor device according to claim 15, wherein said first semiconductor component has a positive temperature coefficient, and said second semiconductor component has a negative temperature coefficient.

* * * * *